United States Patent [19]

Mametsa et al.

[11] Patent Number: 5,363,113
[45] Date of Patent: Nov. 8, 1994

[54] ELECTROMAGNETIC ANTENNA AND EXCITATION ANTENNA PROVIDED WITH SUCH ELECTROMAGNETIC ANTENNA FOR A NUCLEAR MAGNETIC RESONANCE APPARATUS

[75] Inventors: Henri-Jose Mametsa, Castanet Tolosan; Hervé Jacob, Cugnaux, both of France

[73] Assignee: General Electric CGR S.A., Paris, France

[21] Appl. No.: 439,031

[22] PCT Filed: May 3, 1988

[86] PCT No.: PCT/FR88/00214

§ 371 Date: May 16, 1991

§ 102(e) Date: May 16, 1991

[87] PCT Pub. No.: WO88/08971

PCT Pub. Date: Nov. 17, 1988

[30] Foreign Application Priority Data

May 7, 1987 [FR] France .................. 87 06485

[51] Int. Cl.[5] .......................... H01Q 11/12
[52] U.S. Cl. ...................... 343/744; 343/842
[58] Field of Search ........... 343/741, 742, 744, 748, 343/788, 866, 842; 29/600; H01Q 11/12, 7/04

[56] References Cited

U.S. PATENT DOCUMENTS

| | | | |
|---|---|---|---|
| 2,419,539 | 4/1947 | Clark et al. | 343/728 |
| 2,419,673 | 4/1947 | Busignies et al. | 343/867 |
| 2,423,083 | 7/1947 | Daubaras | 343/842 |
| 2,465,381 | 3/1949 | Libby | 343/842 |
| 3,902,177 | 8/1975 | Mori et al. | 343/842 |
| 3,973,263 | 8/1976 | Green | 343/744 |
| 4,518,965 | 5/1985 | Hidaka | 343/744 |
| 4,801,944 | 1/1989 | Manick et al. | 343/744 |

FOREIGN PATENT DOCUMENTS

| | | |
|---|---|---|
| 0145915 | 6/1985 | European Pat. Off. |
| 0156979 | 10/1985 | European Pat. Off. |
| 0200078 | 12/1986 | European Pat. Off. |
| 0209412 | 1/1987 | European Pat. Off. |
| 0222982 | 5/1987 | European Pat. Off. |
| 0249298 | 12/1987 | European Pat. Off. |
| 3140319 | 4/1983 | Germany. |
| 8400214 | 1/1984 | WIPO. |

*Primary Examiner*—Donald Hajec
*Assistant Examiner*—Tan Ho
*Attorney, Agent, or Firm*—Nilles & Nilles

[57] ABSTRACT

By associating an open conductive shield with a radiating loop, it is possible to limit transmission of the electric field for the benefit of transmission of a magnetic field alone. It is shown in particular in the nuclear magnetic resonance imaging field that the antenna becomes less sensitive to the dielectric behavior of the zone in which the emitted field is radiated.

17 Claims, 2 Drawing Sheets

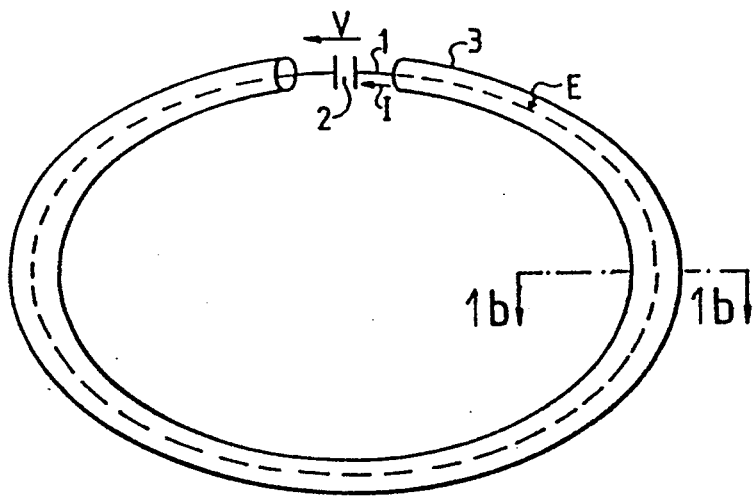
FIG.1a
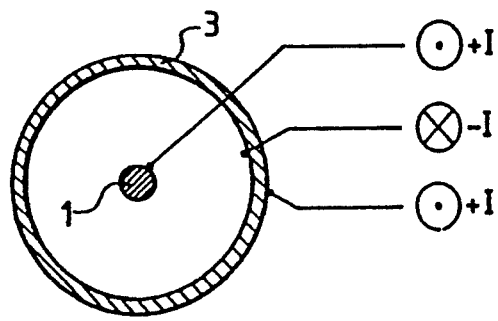
FIG.1b
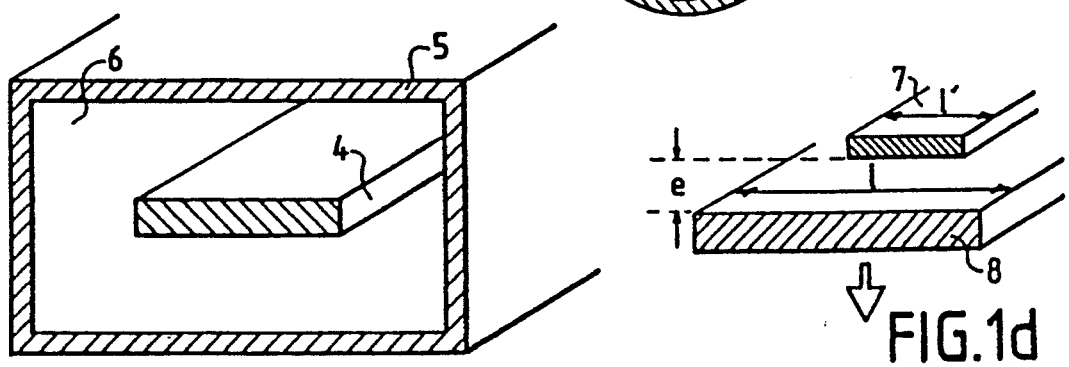
FIG.1c
FIG.1d
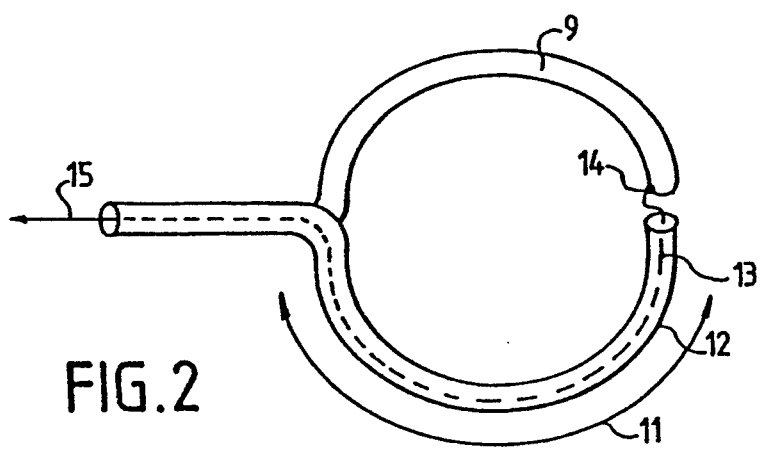
FIG.2

ELECTROMAGNETIC ANTENNA AND EXCITATION ANTENNA PROVIDED WITH SUCH ELECTROMAGNETIC ANTENNA FOR A NUCLEAR MAGNETIC RESONANCE APPARATUS

BACKGROUND OF THE INVENTION

1. Field of the Invention

The present invention relates to an electromagnetic antenna and to an excitation antenna for a nuclear magnetic resonance (NMR) apparatus equipped with an electromagnetic antenna of this type. Although a primary application is in the medical field in which NMR devices are employed for diagnosis, the invention is also useful in other fields for reducing the influence of an electric field radiated by, or received by, a radiating circuit.

2. Description of the Prior Art

An NMR imaging device is essentially equipped with means whereby a patient's body to be examined is subjected to a uniform, constant and high-strength magnetic field $B_O$. While the body is subjected to this influence, a radiofrequency electromagnetic excitation is then applied to the body by an excitation antenna in order to induce resonance of oscillation of the magnetic moments of body particles. After this excitation, a measurement is performed on the resonance signal emitted as feedback by the body when the magnetic moments of the particles tend to realign themselves with the field $B_O$. For certain regions of the body such as the head, for example, transmitter-receiver antennas are employed. These antennas, which are represented schematically by a radiating loop, produce and pick-up the magnetic fields. By virtue of the distribution of potential within the circuit formed by said loop, there is produced an electric field which does not contribute to formation of the image. At the time of transmission, this electric field in fact lowers the efficiency of the antenna by causing losses by current induced within the patient. Thus the entire quantity of energy is not employed for establishing the high-frequency magnetic field. On reception, the radiating loop collects from the resonance signal an electric field component which produces a disturbance in the magnetic field component and which it is sought to measure alone. An attempt has already been made to solve this problem by reducing the mean electric field produced or picked-up by the antenna. In practice, steps are taken to ensure that a midpoint of said antenna is maintained at a constant potential at the moment of resonance. Two ends of the antenna then resonate in phase opposition and produce or pick-up electric fields in phase opposition having an intensity of one-half the value of the electric fields which would be produced or picked-up by the midpoint of said antenna if its two ends were maintained at equal and constant potentials. While achieving an improvement, this solution is not sufficient for ensuring efficiency of the antenna.

OBJECTS AND SUMMARY OF THE INVENTION

An object of the invention is to overcome the above-mentioned disadvantages by proposing an antenna of a special type. The antenna in accordance with the invention essentially comprises a radiating circuit masked by a conductive shield. The shield has two faces, namely a face located opposite to the radiating circuit and an outer face. The function of the shield is to confine the electric field within a space located between the radiating circuit and the shield. By means of its outer face, the shield is capable of radiating a magnetic field while preventing propagation of the confined electric field. The most effective way of constructing the shield consists in surrounding the radiating circuit by an open conductive shield. At the limits of this shield, the current passes from one face of the shield to the other.

The present invention accordingly relates to an electromagnetic antenna which includes a radiating circuit masked by an open conductive shield. The invention further relates to an electromagnetic antenna which includes a radiating circuit masked by a shield for preventing transmission of the electric field without preventing transmission of the magnetic field. Finally, the invention relates to an excitation antenna for a nuclear magnetic resonance (NMR) imaging apparatus equipped with four electromagnetic antennas in accordance with the invention and connected to a transmitter-receiver circuit, said circuit being provided with a 3-dB coupler connected to an impedance-tuning circuit for performing the function of duplexer between the four electromagnetic antennas and the transmitter-receiver circuit.

BRIEF DESCRIPTION OF THE DRAWINGS

FIGS. 1a and 1b are views respectively in perspective and in cross-section showing an electromagnetic antenna in accordance with the invention.

FIGS. 1c and 1d illustrate alternative embodiments of the shield.

FIG. 2 illustrates a symmetrized induction loop for excitation or reception of an induced signal in the antenna of the invention.

DETAILED DESCRIPTION OF THE PREFERRED EMBODIMENTS

Figure 3:
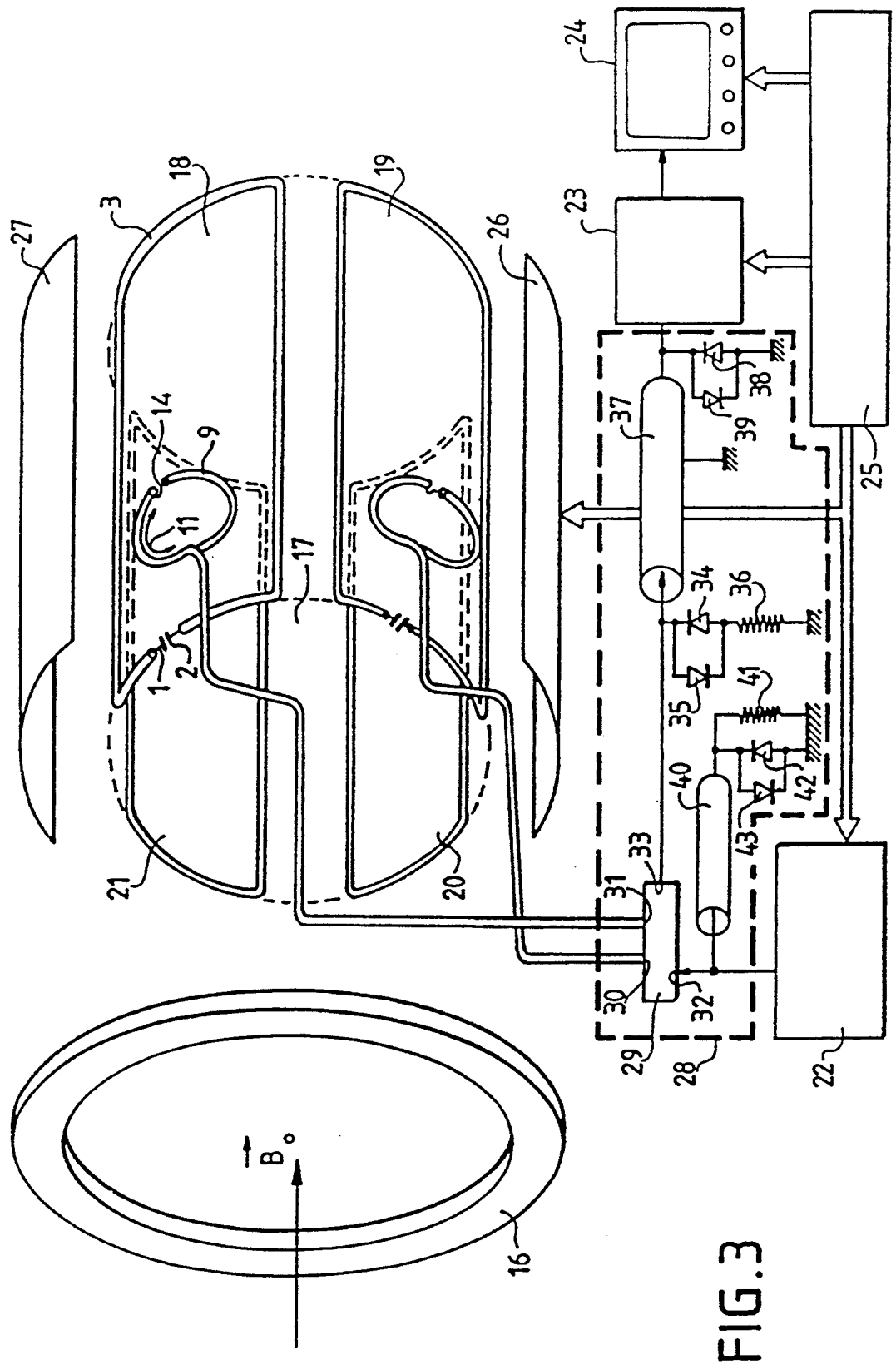
FIG. 3 illustrates a preferred example of application of the antenna of the invention in a nuclear magnetic resonance (NMR) imaging apparatus.

FIG. 1 shows an electromagnetic antenna comprising a radiating circuit and a shield. The radiating circuit presented in this figure includes a conductor 1 which is formed in a loop and the two ends of which are connected to each other through a capacitor 2. The self-inductance of the loop 1 associated with the capacitor 2 permits resonance of the radiating circuit at a characteristic frequency. The radiating circuit is almost totally masked by an open conductive shield 3 having facing ends located proximate the ends of the conductor 1 to define an aperture therebetween. In practice, the conductor 1 can be the core of a coaxial cable, the braided wire covering 3 of which serves as a shield for propagation of an electric field. When the radiating circuit is supplied with current, an alternating-current voltage having an amplitude V is developed at the terminals of the capacitor 2. An alternating current having an amplitude I then flows through the conductor 1. By virtue of a skin effect, the current I flows at the outer periphery of the conductor 1 (FIG. 1b). The alternating magnetic field at the center of the shield 3 is null: an alternating magnetic field cannot develop within the interior of a conductor. In consequence, a current whose total intensity is equal and opposite in direction to the current I passes along the internal face of the shield 3. An electric field is consequently developed between the conductor 1 and the inner face of the shield 3. The current which passes within the conductive shield is closed by the outer face of the shield.

The result thereby achieved is that a current whose intensity is equal to and has the same direction as the current I which flows through the central conductor 1 now passes along the outer face of the shield. The currents which flow on the inner and outer surfaces of the shield have axes which coincide and opposite directions of flow. The two currents combined therefore do not give rise to any magnetic field distribution in their environment. The self-inductance of the assembly consisting of inner surface and outer surface of the shield is consequently very low and no voltage is therefore developed at the ends of the shield induced by the current which flows along these surfaces. The shield thus performs the function of a zero equipotential surface without disturbing the magnetic field induced by the current which flows within the conductor 1. In the final analysis, the current which flows outside the shield 3 is only a current induced by the current which flows within the central conductor of the radiating circuit. In order to ensure that this induction is as efficient as possible, the central conductor and the shield have a circular shape. In this manner, the current which passes along the core 1 induces without any loss the reverse current which passes along the inner face of the shield 3.

FIGS. 1c and 1d show alternative forms of construction of the electromagnetic antenna in accordance with the invention. In particular, in order to take the skin effect into account more effectively, a flat shape 4 is preferred for the central conductor 1. Under these conditions, the conductor 4 and the shield 5 naturally have a rectangular cross-section. The material which separates the core 4 from the shield 5 must be an insulating material having very low loss. This means that its dielectric constant must be as close as possible to 1. The reason for this is as follows: the radiating circuit resonates by virtue of the presence of the capacitor 2 at a frequency $f_O$. In fact, this capacitor 2 is placed in parallel with the distributed capacitance resulting from the proximity of the shield 5 and of the central conductor 4. Just as it is known to manufacture capacitors for localized use which meet high quality standards (with very low losses), so it is necessary to devote identical care to the materials which separate the shield from the radiating circuit. The best solution would be to create a vacuum or if necessary to fill this space with air. However, this solution is subject to a disadvantage from a mechanical standpoint in that position-maintenance of the core 4 is not ensured. In order to simplify the manufacture, the core 4 is coated with silicon-containing materials and then covered with the shield 5. Since the silicon-containing materials do not exhibit very good dielectric behavior, this behavior is improved by including air microbubbles in the silicon-containing material. Preferably, the material 6 which fills the space between the shield 5 and the core 4 is therefore a foam.

In order to simplify the fabrication process still further, it is possible to make use of printed circuits. In accordance with this technique, the radiating circuit is formed on one of the faces of a support. For example, a conductive lead 7 representing a radiating conductor is closed in a loop in series with a capacitor whereas a conductive lead 8 located directly beneath the lead 7 is also etched on the other face of the support. In order to perform its shield function more effectively, the lead 8 preferably has a width l of greater value than the width l' of the lead 7. It is readily apparent that the lead 8 is an open connection. By way of example, its opening can be placed vertically opposite to the location at which the capacitor 2 is installed in the radiating circuit. The thickness e and the quality of the material in which is formed the support of the antenna in accordance with the invention are chosen as a function of the magnetic coupling properties to be obtained between the conductor 7 and the shield 8 and as a function of the losses produced by the distributed capacitances resulting from this opposite location. The region of space in which the radiated field does not have any electric component is indicated by the hollow arrow and is placed against the outer face of the shield.

Even when constructed in the alternative forms shown in FIGS. 1c and 1d, the loop of FIG. 1a must be fed and capable of restituting the signal which it detects according to whether it is employed either in the excitation mode or the detection mode. Preferably and in accordance with the invention, the electromagnetic antenna is in coupling relationship with an induction loop 9 of the type shown in FIG. 2. This induction loop is distinguished by the fact that it is symmetrized. Symmetrization of the induction loop is obtained by forming in this latter a high-frequency line segment 11 (for example a segment of coaxial cable) provided with a shield conductor 12 and an inner conductor 13 which is connected at one end 14 to the remainder of the loop for ensuring its supply and at the other end 15 to a transmitter-receiver circuit. Preferably, the line segment 11 has a length equal to one-half of the induction loop in order to ensure symmetrization.

FIG. 3 shows a particular example of utilization of an electromagnetic antenna in accordance with the invention.

In an NMR imaging apparatus, a magnet illustrated schematically and designated by the reference 16 produces an orienting induction field $B_O$ in a region 17 of the space in which it is intended to place a body to be studied. In the medical field, a patient's body is introduced within said space in a recumbent position, for example. When subjected to this orienting field, the magnetic moments of the body particles tend to align with the body. In the case of an excitation antenna which can be used both in transmission and in reception and which comprises four electromagnetic antennas 18 to 21 in accordance with the invention, it is possible to tilt the orientation of the magnetic moments away from their alignment along $B_O$. When the excitation is discontinued, the excitation antenna can be employed for measuring the signal re-emitted by the particles when their magnetic moments tend to realign with the field $B_O$. Under these conditions, the NMR imaging apparatus includes a generator 22 for applying the excitations to the excitation antenna and a receiver 23 connected to the excitation antenna for receiving the re-emitted signal resulting from a return to equilibrium on completion of these excitations. The receiver 23 can also comprise in known manner means for processing the received signal in order to extract therefrom data which are capable of serving for representation, in a device 24, of sections of the body which is being studied. In order to operate this assembly, a sequencer 25 initiates the operation of the generator 22, of the receiver 23, of the display device 24 as well as those gradient coils 26, 27 which serve to code the transmitted and received signal so as to permit reconstruction of the images of the body sections.

A duplexer 28 is interposed between the antenna 18–21 and the transmitter-receiver 22–23. This duplexer 28 essentially includes a 3-dB coupler 29. Two outputs 30 and 31 in phase quadrature of the coupler are each connected respectively to a pair of electromagnetic antennas in accordance with the invention, namely on the one hand the pair 19 and 21 and on the other hand the pair 18 and 20. The electromagnetic antennas of each pair are each placed approximately symmetrically with respect to the body to be examined. The pairs of electromagnetic antennas radiate and capture substantially orthogonal magnetic field components. The electromagnetic antennas are each coupled with an induction loop. The directions of flow of currents within each induction loop of opposite pairs of antennas are reversed so as to ensure that the field produced at the moment of excitation is a rotating field. Thus the antenna is also particularly well-suited to reception of a rotating electromagnetic field. It is known in NMR that this arrangement makes it possible to gain a factor of three dB at the moment of transmission and reception of the signal.

The coupler 29 also has an input 32 for the generator 22 and an output 33 for the receiver 23. From a practical standpoint, the electromagnetic antennas 18 to 21 are placed on a circular structure such as a mandrel, for example (not shown in the drawings). However, the distinctive feature of this structure lies in the fact that the position of the induction loops such as the loop 9 with respect to the radiating circuit of each electromagnetic antenna can be modified so as to perform correct impedance matching of each pair of antennas.

In order to perfect impedance matching and to utilize the directional coupler under optimum conditions, other balancing circuits are provided. In particular, during transmission, if the excitation antenna is mismatched, part of the transmitted signal passes directly through the reception output 33. At this output, the signal accordingly "sees" two impedances in parallel. A first impedance is constituted by a pair of diodes 34, 35 mounted top-to-tail in series with a resistor 36. A second impedance applied by a line 37 is constituted by another pair 38, 39 of diodes mounted in top-to-tail relation. The length of the line 37 is equal to $\lambda/4$. The length $\lambda$ represents the wavelength, within the line 37, of the wave which propagates therein at the resonance frequency of the apparatus. At the time of transmission, the signal has high strength, with the result that the conduction thresholds of the diodes 34, 35 and 38, 39 may be considered as null. In consequence, the high-frequency line 37 loaded by a short-circuit applies to its input an open circuit having an infinite impedance. Moreover, the resistor 36 is a resistor having a value equal to a characteristic impedance (50 ohms, for example). The result thereby achieved is that the output 33 is loaded on transmission by a matched load. Under these conditions, the entire energy transmitted is available on the channels 30 and 31.

At the time of reception, the generator 22 is out of service and therefore the channel 32 is loaded through a line 40 by a resistor 41 having a characteristic impedance. Since the resistor 41 is also equal to the characteristic resistance, the channel 32 is therefore loaded by a characteristic resistance. However, in order to ensure that this circuit (40, 41) does not play any part which is liable to have an adverse effect on transmission, the resistor 41 is in parallel with two diodes 42, 43 mounted in top-to-tail relation and the length of the line 40 also has a value of $\lambda/4$. At the time of transmission, the high-strength signal short-circuits the diodes 43 and 42 and this short-circuit is applied to the input of the line 40 in the form of a circuit having infinite impedance. During reception, none of the diodes is conductive, with the result that the signal received on the channel 33 is passed directly into the receiver 23.

We claim:

1. An electromagnetic antenna for exciting a region of space, comprising:
   (A) a radiating circuit;
   (B) an open conductive shield which is electrically connected to nothing, which almost totally masks said radiating circuit with respect to said region of space, and which has an aperture formed therein;
   (C) a capacitor which is placed in said radiating circuit at the location of said aperture of said shield and which tunes said radiating circuit to resonate at a predetermined frequency; and
   (D) an electrical circuit which is connected to an electrical source and which feeds an electrical current to said radiating circuit.

2. An antenna according to claim 1, wherein said shield comprises an open conductive sheath.

3. An antenna according to claim 2, wherein said sheath has a substantially rectangular cross-section.

4. An antenna according to claim 2, further comprising an insulating material which has a low dielectric loss and which separates said sheath from aid radiating circuit.

5. An antenna as defined in claim 1, wherein said electrical circuit is an induction loop which feeds current to said radiating circuit by induction.

6. An electromagnetic antenna for exciting a region of space, comprising:
   (A) a radiating circuit;
   (B) an open conductive shield which is eclectically connected to nothing, which almost totally masks said radiating circuit with respect to said region of space, and which has an aperture formed therein;
   (C) a capacitor which is placed in said radiating circuit at the location of said aperture of said shield and which tunes said radiating circuit to resonate at a predetermined frequency; and
   (D) an electrical circuit which is connected to an electrical source and which feeds an electrical current to said radiating circuit, wherein
   said radiating circuit comprises a first conductive lead formed on one face of a support,
   said shield comprises a second conductive lead formed opposite to said first conductive lead on another face of said support, and wherein
   said second conductive lead is of a substantially greater width than said first conductive lead.

7. An antenna according to claim 6, wherein said first and second leads are etched onto the respective faces of said support.

8. A device comprising:
   (A) an induction loop; and
   (B) an electromagnetic antenna for exciting a region of space, said antenna being coupled with said induction loop, said antenna including
   a radiating circuit receiving current from said induction loop,
   an open conductive shield which is electrically connected to nothing which almost totally masks said radiating circuit with respect to said region of space, and which has an aperture formed therein, a capacitor which is placed in said radiating circuit at the location of said aperture of said shield and which tunes said radiating circuit to resonate at a predetermined frequency.

9. An antenna according to claim 8, further comprising a transmitter-receiver circuit for transmitting and receiving the excitation of said antenna, wherein said induction loop comprises a high-frequency line segment provided with a core and a shield conductor, said core of said line segment being connected to the remainder of said induction loop and to said transmitter-receiver circuit, said shield conductor being employed in conjunction with said induction loop for ensuring symmetrization of said loop.

10. An electromagnetic antenna for exciting a region of space, comprising:
    (A) a radiating circuit formed in a loop, said radiating circuit including a conductor which has two ends;
    (B) a conductive shield which is electrically connected to nothing and which almost totally masks said radiating circuit with respect to said region of space, said shield having two ends which face one another to define an aperture therebetween;
    (C) a capacitor which is placed in said aperture of said shield and which is connected to said ends of said conductor, said capacitor tuning said radiating circuit to resonate at a predetermined frequency; and
    (D) an electrical circuit which is connected to an electrical source and which feeds an electrical current to said radiating circuit.

11. An antenna according to claim 10, wherein said conductive shield has an enclosed space formed therein in which is disposed said conductor.

12. An antenna according to claim 11, wherein said shield comprises an annular sheath.

13. An antenna according to claim 12, wherein said conductor is formed from a coaxial cable.

14. An antenna according to claim 11, wherein said shield and said conductor each have a rectangular cross section.

15. An antenna according to claim 10, wherein
    said radiating circuit comprises a first conductive lead formed on one face of a support,
    said shield comprises a second conductive lead formed opposite to said first conductive lead on an opposite face of said support, and wherein
    said second conductive lead is of a substantially greater width than said first conductive lead.

16. A method of exciting a region of space with an electromagnetic antenna, comprising the steps of:
    (A) supplying a first current to a radiating circuit from an electrical circuit, said radiating circuit having a conductor which is almost totally masked with respect to said region of space by an open conductive shield which has an aperture formed therein and which is electrically connected to nothing isolated from its outside environment, said radiating circuit having a capacitor placed therein at the location of said aperture of said shield;
    (B) developing, from said first current, an alternating-current voltage at said capacitor, said alternating-current voltage developing an alternating current of magnitude I in said conductor, thus tuning said radiating circuit to resonate at a predetermined frequency and exciting said region of space; and
    (C) inducing, from said current developed by said capacitor, first and second alternating currents in said shield which each have said magnitude I and which have axes which coincide, said first and second currents flowing in opposite directions.

17. A method as defined in claim 16, wherein said supplying step comprises supplying said first current to said radiating circuit by induction.

* * * * *